United States Patent
Hui Chen et al.

(10) Patent No.: US 11,924,964 B2
(45) Date of Patent: Mar. 5, 2024

(54) PRINTED CIRCUIT BOARD FOR GALVANIC EFFECT REDUCTION

(71) Applicant: Western Digital Technologies, Inc., San Jose, CA (US)

(72) Inventors: Lin Hui Chen, Taichung (TW); Songtao Lu, Shanghai (CN); Chien Te Chen, Taichung (TW); Yu Ying Tan, Taichung (TW); Huang Pao Yi, Taichung (TW); Ching Chuan Hsieh, Taichung (TW); T. Sharanya Kaminda, Bengaluru (IN); Chia-Hsuan Huang, Huang (TW)

(73) Assignee: Western Digital Technologies, Inc., San Jose, CA (US)

( * ) Notice: Subject to any disclaimer, the term of this patent is extended or adjusted under 35 U.S.C. 154(b) by 216 days.

(21) Appl. No.: 17/715,673

(22) Filed: Apr. 7, 2022

(65) Prior Publication Data
US 2023/0328873 A1    Oct. 12, 2023

(51) Int. Cl.
*H05K 1/11* (2006.01)
*H05K 1/02* (2006.01)

(52) U.S. Cl.
CPC .......... *H05K 1/0218* (2013.01); *H05K 1/116* (2013.01); *H05K 2201/09381* (2013.01); *H05K 2201/0939* (2013.01)

(58) Field of Classification Search
CPC ........ H05K 1/116; H05K 1/117; H05K 1/115; H05K 1/111; H05K 1/0218; H05K 1/025; H05K 2201/09381; H05K 2201/0939
See application file for complete search history.

(56) References Cited

U.S. PATENT DOCUMENTS

| | | | |
|---|---|---|---|
| 5,637,835 A | 6/1997 | Matern | |
| 6,423,904 B1* | 7/2002 | Hayami | H05K 1/117 |
| | | | 174/265 |
| 10,051,725 B2* | 8/2018 | Kawazu | H05K 1/111 |
| 10,231,327 B1* | 3/2019 | Murakami | H05K 1/0219 |
| 11,234,327 B1 | 1/2022 | Lu et al. | |
| 2004/0261263 A1* | 12/2004 | Nelson | H05K 3/242 |
| | | | 29/846 |
| 2006/0043572 A1 | 3/2006 | Sugimoto et al. | |

(Continued)

FOREIGN PATENT DOCUMENTS

JP         2018010972 A       1/2018

*Primary Examiner* — Hoa C Nguyen
(74) *Attorney, Agent, or Firm* — Michael Best & Friedrich LLP (57) ABSTRACT

Devices and methods are described for reducing etching due to Galvanic Effect within a printed circuit board (PCB) that may be used in an electronic device. Specifically, a contact trace is coupled to a contact finger that has a substantially larger surface area than the contact trace. The contact finger is configured to couple the electronic device to a host device. The contact trace is electrically isolated from the rest of the PCB circuitry during a fabrication process by a separation distance between an exposed portion of the contact trace and an impedance trace. The contact finger and the exposed portion of the contact trace are plated with a common material to reduce galvanic etching of the contact trace during fabrication. The contact trace is then connected to the impedance trace using a solder joint.

20 Claims, 8 Drawing Sheets

(56) References Cited

U.S. PATENT DOCUMENTS

| | | | |
|---|---|---|---|
| 2010/0328920 A1* | 12/2010 | Nikaido | H05K 1/142 |
| | | | 361/803 |
| 2016/0316560 A1 | 10/2016 | Sakai et al. | |
| 2019/0159334 A1* | 5/2019 | Kagaya | H05K 1/0225 |
| 2019/0189164 A1* | 6/2019 | Huddar | H05K 3/4038 |
| 2020/0029431 A1* | 1/2020 | Hayashi | H05K 1/116 |
| 2021/0337662 A1* | 10/2021 | Wang | H01S 5/40 |

* cited by examiner

PRINTED CIRCUIT BOARD FOR GALVANIC EFFECT REDUCTION

BACKGROUND

This application relates generally to printed circuit boards, and more particularly, to a configuration of traces and connections within a printed circuit board that are configured to reduce the Galvanic Effect between traces and connections that include different metallic materials.

Printed circuit boards (PCB) or substrates are used to provide electrical connections between electronic components, such as integrated circuit dies and passive components and other components mounted on the PCB or substrate, as well as external electrical connections to the components mounted on the PCB. Some electronic devices, such as hybrid flip chip products used in card type applications (for example, SD cards, microSD cards, USB cards, and the like) are cleaned using a cleaning chemical prior to a finish being applied to the metal components on the substrate (for example, Organic Solder-ability Preservatives ("OSP")). Further, the general structure of a hybrid flip chip product features a metallic finger that provides a connection to a host device and is constructed of a first material. The host device also has an associated internal connection or trace constructed of a second, different metallic material. The cleaning chemical, combined with the metallic finger having a much larger surface area of metal as opposed to the internal connection points that are electrically connected to the metallic finger results in a voltage differential between the metallic finger and the associated internal connection point. This voltage differential can result in over etching of the internal connection point, causing potential weakening or increased resistance of the internal connection points or traces. That is, the over-etching is caused by corrosion due to the Galvanic Effect, which occurs when two dissimilar metals are placed in a corrosive environment.

SUMMARY

Etching of traces on a PCB during a cleaning process can require the traces to be oversized for a given application to account for the Galvanic Effect. By controlling the amount of etching due to the Galvanic Effect, the width and thickness of the PCB traces can be better controlled, allowing for trace impedances to be accurately determined and maintained.

In one embodiment, the present disclosure provides a PCB for an electronic device, which includes a substrate having a first side and a second side opposite to the first side, and a contact finger disposed on the first side of the substrate configured to interface with a host device. The electronic device further includes a contact trace coupled to the contact finger that extends from the first side of the substrate to the second side of the substrate. The contact trace has an exposed portion disposed on the second side of the substrate in the form of a via connection pad. The electronic device further includes an impedance trace disposed on the second side of the substrate and configured to be coupled to one or more components of the electronic device. An outer pad is coupled to the impedance trance which surrounds the via connection pad and is separated from the via connection pad by a separation distance. The contact finger and the via connection pad are plated with a common material to reduce galvanic etching of the first contact trace, and the exposed portion of the contact trace is electrically connected to the impedance trace by way of a solder joint.

In another embodiment, the present disclosure provides, a method for reducing etching due to Galvanic Effect in a PCB of an electronic device. The method includes determining a ratio of a surface area of a contact finger to a surface area of an exposed portion of a contact trace electrically connected to the contact finger, wherein the contact finger is configured to provide an electronic connection to a host device. The method further includes determining whether the ratio exceeds a predetermined threshold, and, responsive to determining that the ratio exceeds the predetermined threshold, separating the exposed portion of the contact trace into a via connection pad and an outer connection pad configured to be coupled to an impedance trace, wherein the via connection pad and outer connection pad are physically separated by a separation distance. The method further includes plating the contact finger and the via connection pad with a common material, and electrically connecting the via connection pad and the outer connection pad using a solder joint.

In one embodiment of the of the present disclosure, a card-type data storage device is provided, including a substrate having a first side and a second side opposite the first side, and a contact finger disposed on the first side of the substrate configured to interface with a host device and plated with a plating material. The card-type data storage device further includes a first trace coupled to the first contact finger and extending from the first side of the substrate to the second side of the substrate. The first trace has an exposed portion disposed on the second side of the substrate in the form of a via connection pad, the via connection pad being plated with the plating material. The card-type data storage device also includes a second trace disposed on the second side of the substrate and coupled to an outer pad, wherein the outer pad surrounds the via connection pad and is electrically separated from the via connection pad by a separation distance. The via connection pad is electrically connected to the outer pad through solder joint.

Various aspects of the present disclosure provide for improvements in memory devices. For example, reducing etching due to galvanic effect reduces impedance variation in traces, and allows for more precise trace design. The present disclosure can be embodied in various forms. The foregoing summary is intended solely to give a general idea of various aspects of the present disclosure and does not limit the scope of the present disclosure in any way.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to a memory device and particularly a NAND flash, the concepts discussed herein are applicable to other types of solid-state memory, such as NOR, PCM ("Phase Change Memory"), ReRAM, etc., as well as other types of electronic devices. Those of skill in the art also will realize that although the disclosure refers to a PCB or substrate used in a data storage device, the disclosure may apply to substrates used in other types of electronic devices. The disclosure applies to both substrates and printed circuit boards used in electronic devices.

Figure 1:
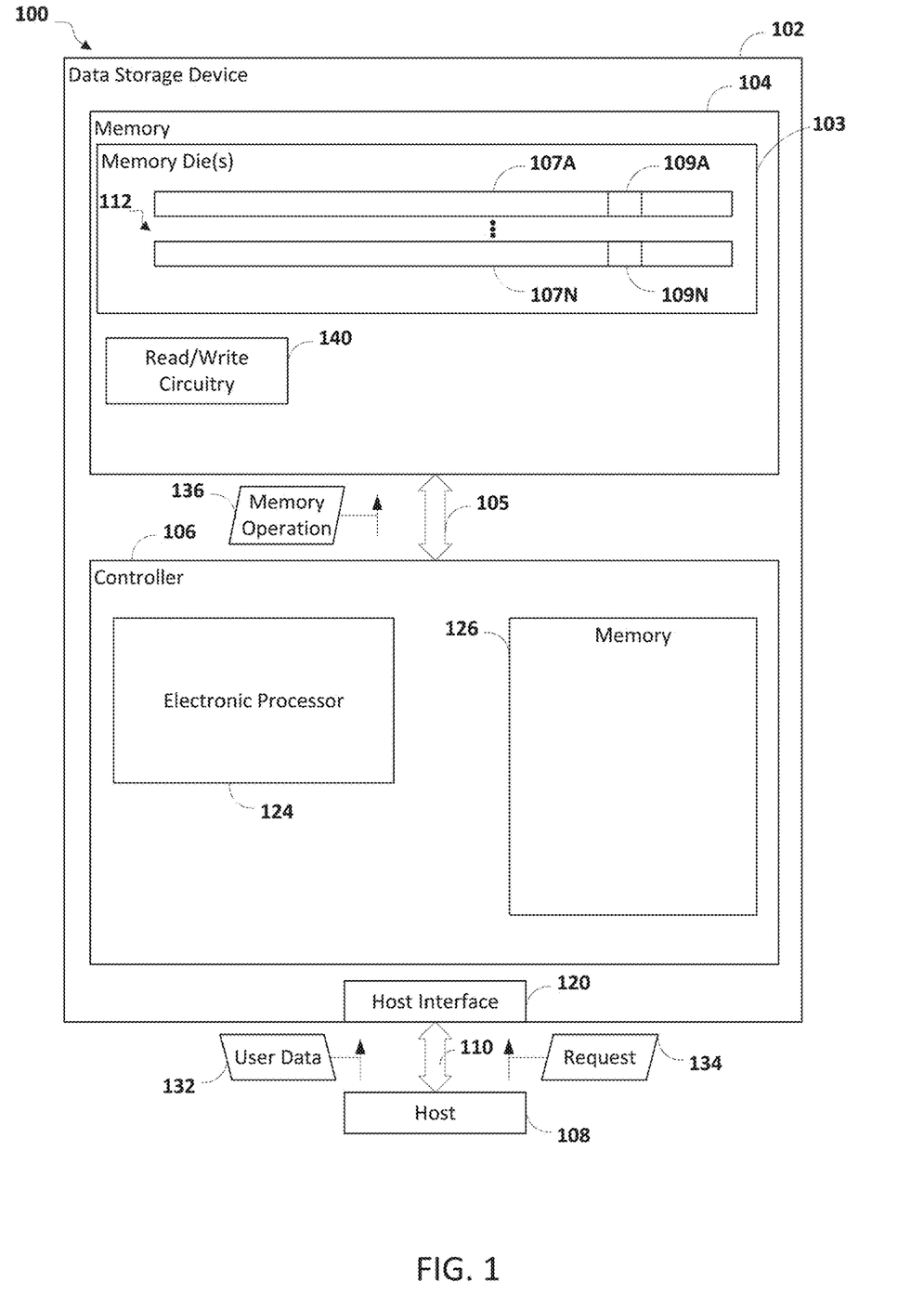
FIG. 1 is block diagram of one example of a system including a data storage device, according to some embodiments.

FIG. 1 is a block diagram of one example of a system 100 that includes a data storage device 102 in communication with a host device 108. The data storage device 102 includes a memory device 104 (e.g., non-volatile memory) that is coupled to a controller 106.

One example of the structural and functional features provided by the controller 106 are illustrated in FIG. 1. However, the controller 106 is not limited to the structural and functional features provided by the controller 106 in FIG. 1. The controller 106 may include fewer or additional structural and functional features that are not illustrated in FIG. 1.

The data storage device 102 and the host device 108 may be operationally coupled with a connection (e.g., a communication path 110), such as a bus or a wireless connection. In some examples, the data storage device 102 may be embedded within the host device 108. Alternatively, in other examples, the data storage device 102 may be removable from the host device 108 (i.e., "removably" coupled to the host device 108). As an example, the data storage device 102 may be removably coupled to the host device 108 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 108 with the communication path 110, such as a wired communication path and/or a wireless communication path. For example, the data storage device 102 may include an interface 120 (e.g., a host interface) that enables communication over the communication path 110 between the data storage device 102 and the host device 108, such as when the interface 120 is communicatively coupled to the host device 108. In some embodiments, the communication path 110 may include one or more electrical signal contact pads or fingers that provide electrical communication between the data storage device 102 and the host device 108.

The host device 108 may include a processor and a memory. The memory may be configured to store data and/or instructions that may be executable by the processor. The memory may be a single memory or may include one or more memories, such as one or more non-volatile memories, one or more volatile memories, or a combination thereof. The host device 108 may issue one or more commands to the data storage device 102, such as one or more requests to erase data at, read data from, or write data to the memory device 104 of the data storage device 102. For example, the host device 108 may be configured to provide data, such as user data 132, to be stored at the memory device 104 or to request data 134 to be read from the memory device 104. The host device 108 may include a mobile smartphone, a music player, a video player, a gaming console, an electronic book reader, a personal digital assistant (PDA), a computer, such as a laptop computer or notebook computer, any combination thereof, or other suitable electronic device.

The host device 108 communicates with a memory interface that enables reading from the memory device 104 and writing to the memory device 104. In some examples, the host device 108 may operate in compliance with an industry specification, such as a Universal Flash Storage (UFS) Host Controller Interface specification. In other examples, the host device 108 may operate in compliance with one or more other specifications, such as a Secure Digital (SD) Host Controller specification or other suitable industry specification. The host device 108 may also communicate with the memory device 104 in accordance with any other suitable communication protocol.

The memory device 104 of the data storage device 102 may include a non-volatile memory (e.g., NAND, BiCS family of memories, or other suitable memory). In some examples, the memory device 104 may be any type of flash memory. For example, the memory device 104 may be two-dimensional (2D) memory or three-dimensional (3D) flash memory. The memory device 104 may include one or more memory dies 103. Each of the one or more memory dies 103 may include one or more memory blocks 112 (e.g., one or more erase blocks). Each memory block 112 may include one or more groups of storage elements, such as a representative group of storage elements 107A-107N. The group of storage elements 107A-107N may be configured as a wordline. The group of storage elements 107A-107N may include multiple storage elements (e.g., memory cells that are referred to herein as a "string"), such as a representative storage elements 109A and 109N, respectively.

The memory device 104 may include support circuitry, such as read/write circuitry 140 to support operation of the one or more memory dies 103. Although depicted as a single component, the read/write circuitry 140 may be divided into separate components of the memory device 104, such as read circuitry and write circuitry. The read/write circuitry 140 may be external to the one or more memory dies 103 of the memory device 104. Alternatively, one or more individual memory dies may include corresponding read/write circuitry that is operable to read from and/or write to storage elements within the individual memory die independent of any other read and/or write operations at any of the other memory dies.

The controller 106 is coupled to the memory device 104 (e.g., the one or more memory dies 103) with a bus 105, an interface (e.g., interface circuitry), another structure, or a combination thereof. For example, the bus 105 may include multiple distinct channels to enable the controller 106 to communicate with each of the one or more memory dies 103 in parallel with, and independently of, communication with the other memory dies 103.

The controller 106 is configured to receive data and instructions from the host device 108 and to send data to the host device 108. For example, the controller 106 may send data to the host device 108 using the interface 120, and the controller 106 may receive data from the host device 108 with the interface 120. The controller 106 is configured to send data and commands (e.g., the memory operation 136, which may be a cycle operation of a memory block of the memory device 104) to the memory device 104 and to receive data from the memory device 104. For example, the controller 106 is configured to send data and a program or write command to cause the memory device 104 to store data to a specified address of the memory device 104. The write command may specify a physical address of a portion of the memory device 104 (e.g., a physical address of a word line of the memory device 104) that is to store the data.

The controller 106 is configured to send a read command to the memory device 104 to access data from a specified address of the memory device 104. The read command may specify the physical address of a region of the memory device 104 (e.g., a physical address of a word line of the memory device 104). The controller 106 may also be configured to send data and commands to the memory device 104 associated with background scanning operations, garbage collection operations, and/or wear-leveling operations, or other suitable memory operations.

The controller 106 may include a processor 124, a memory 126, and other associated circuitry. The memory 126 may be configured to store data and/or instructions that may be executable by the processor 124.

The controller 106 may send the memory operation 136 (e.g., a read command) to the memory device 104 to cause the read/write circuitry 140 to sense data stored in a storage element. For example, the controller 106 may send the read command to the memory device 104 in response to receiving a request for read access from the host device 108. In response to receiving the read command, the memory device 104 may sense the storage element 107A (e.g., using the read/write circuitry 140) to generate one or more sets of bits representing the stored data.

Figure 2:
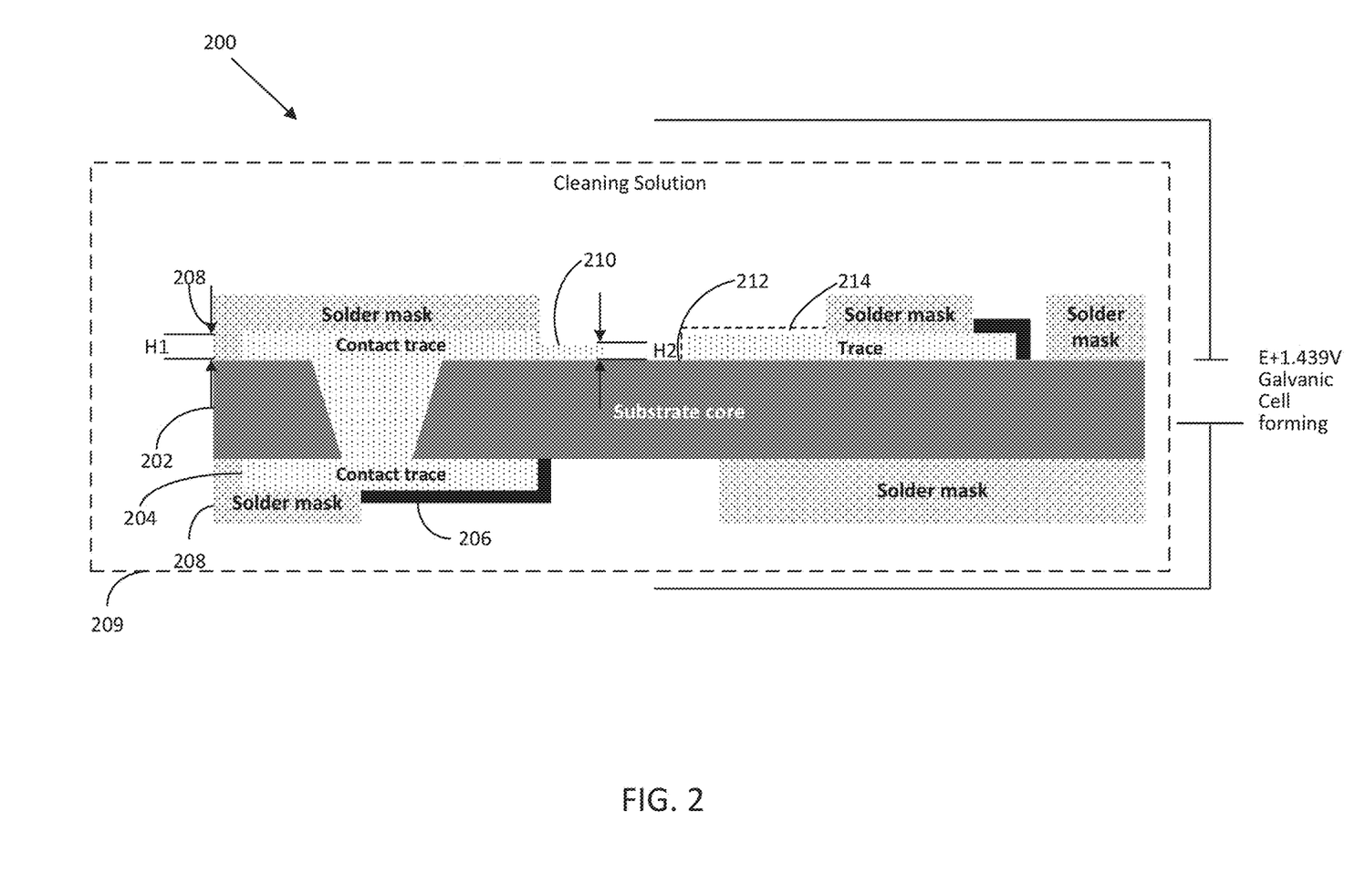
FIG. 2 is an enlarged cross-sectional view of a portion of a substrate used in a data storage device, according to some embodiments.

Turning now to FIG. 2, a cross-sectional view of a general substrate or circuit board 200 used in a data storage device, such as data storage device 102, is provided. The circuit board 200 includes a substrate core 202, a contact finger trace 204, and a contact finger area 206. The contact finger area 206 is configured to provide an electrical connection between the data storage device 102 and a host device, such as host device 108. The contact finger trace 204 is further configured to couple one or more components of the data storage device 102 to the contact finger area 206. Generally, the contact finger trace 204 is constructed of copper ("Cu"); however, other material types are contemplated. Further, during the manufacturing process, the contact finger area 206 is plated with a different material than the contact finger trace 204. In one example, the contact finger area 206 is plated with gold ("Au"). In another example, the contact finger area 206 is plated with a nickel-gold compound. In other examples, other materials may be used as appropriate for a given application.

A solder mask 208 is applied to other portions of the contact finger trace 204 as well during the fabrication process. The solder mask 208 prevents unwanted solder connections from being made to the contact finger trace 204, and also seals portions of the contact finger trace 204 from various solvents or other treatments applied to the data storage device 102, as described in more detail below.

During the manufacturing process a solvent or other cleaning solution 209 is applied to the circuit board 200 prior to a coating being applied to the circuit board. Example coatings may include an organic solderability preservative ("OSP"), which is one or more water-based organic compounds that selectively bond to trace material (e.g., copper) and protects the trace material until soldering is performed. An example cleaning solution 209 may be a Piranha solution or Piranha etch, which is generally a mixture of sulfuric acid ("$H_2SO_4$"), water ("$H_2O$"), and hydrogen peroxide ("$H_2O_2$"). The cleaning solution 209 may be used to clean organic residue from the circuit board 200.

A byproduct of applying the cleaning solution 209 to the circuit board 200 is generally known to be the formation of a galvanic cell due to the different metallic materials used in the contact finger trace 204 and the contact finger area 206 (e.g., copper and gold), which is known as galvanic effect. The cleaning solution 209 acts as a conducting element to allow a redox reaction to occur between the dissimilar metals, wherein the metals lose electrons resulting in a voltage being generated. The contact finger trace 204 includes an exposed trace portion 210 which is generally constructed of copper and has a much smaller area than the contact finger area 206, which is generally constructed of gold. As shown in FIG. 2, a voltage difference of approximately 1.439V is developed between the contact finger area 206 and the exposed trace portion 210. However, voltages of more than 1.439V and less than 1.439V may be generated based on the types of materials used for the exposed trace portion 210 and the contact finger area 206, as well as the difference in exposed surface area between the exposed trace portion 210 and the contact finger area 206. In some examples, a current density of a galvanic cell may be used to determine an etching rate or speed. The current density is based on the ratio of different materials within a trace. This voltage differential results in the exposed trace portion 210 losing material (e.g., copper), which is released to the cleaning solution 209 and or deposited on other traces or portions of the circuit board 200. This is generally known as etching.

As shown in FIG. 2, the exposed trace portion 210 should have a height approximately the same as the contact finger trace 204 along the top edge 212 of the substrate 206. For example, the contact finger trace 204 has a height H1. However, due to the etching caused by the galvanic voltage difference, a substantial portion of the exposed trace portion 210 has been etched away, resulting in the exposed trace portion 210 having a reduced height H2. In one embodiment, the etching may have resulted in a 75% loss of material from the exposed trace portion 210. However, losses of more than 75% or less than 75% may also occur based on the types of material used, and the generated Galvanic voltage differential. This can result in the exposed trace portion 210 weakening, particularly when a component is soldered between the exposed trace portion 210 and another trace, such as trace 214, on the circuit board 200. Additionally, the reduced quantity of material on the exposed trace portion 210 may increase the resistance within the contact finger trace 204, resulting in additional heating of the contact finger trace 204 and/or connected components.

Figure 3:
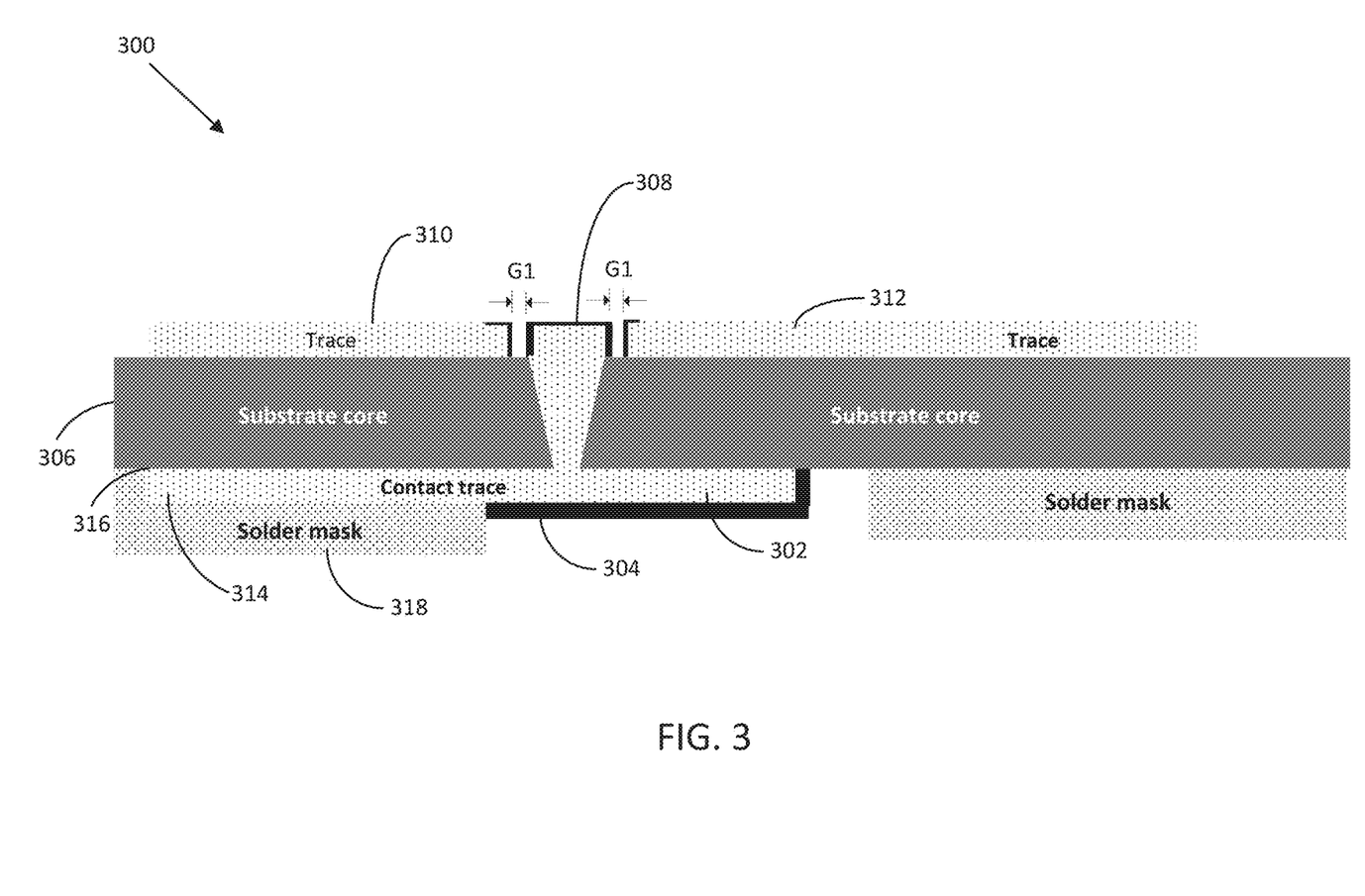
FIG. 3 is an enlarged cross-sectional view of a substrate used in a data storage device with galvanic etching reduction features, according to some embodiments.

Turning to FIG. 3, a cross-sectional area of a modified circuit board 300 is shown that is configured to reduce the effect of etching due to the galvanic effect. Similar to the circuit board 200, the circuit board 300 includes a contact finger trace 302, a contact finger area 304 coupled to the contact finger trace 302, and a substrate 306. As described above, the contact finger trace 302 may be constructed of copper and the contact finger area 304 may be constructed of gold, or other suitable material, such as nickel-gold. The contact finger trace 302 extends through the substrate 306 to a second side of the substrate and forms a via contact pad 308. In some examples, the via contact pad 308 may be referred to as a via connection pad. A first trace 310 and a second trace 312 are separated from the via contact pad 308 by a separation distance G1. The first trace 310 and the second trace 312 may be coupled to various components, connection points, etc., within a data storage device, such as data storage device 102 described above. However, the separation distance G1 prevents electrical contact between the first trace 310 and the second trace 312 until the separation distance G1 is filled during a soldering process, as will be described in more detail below.

The separation distance G1, as will be described in more detail below, provides physical and electrical separation between the via contact pad 308 and the first trace 310 and the second trace 312. In some embodiments, the separation distance G1 is sized to provide minimum distance between the via contact pad 308 and the first trace 310 and the second trace 312. In one example, the separation distance G1 has a distance of 15 microns (15 μm). However, distances of more than 15 microns or less than 15 microns are also considered as required for a given application. In some examples, the separation distance G1 may be within a range of 1 micron to 100 microns.

In some examples, the via contact pad 308 may be coated in a material similar to the contact finger area 304, such as gold or nickel-gold to reduce etching due to galvanic effect. Furthermore, while not shown, portions of the first trace 310 and the second trace 312 adjacent to the via contact pad 308 may also be coated with a material similar to that of the via contact pad 308 to improve a connection between the via contact pad 308, the first trace 310 and the second trace 312. As will be described in more detail below, the first trace 310 and the second trace 312 may be electrically coupled but still electrically separate from the via contact pad 308.

Additionally, while shown as being positioned directly over the contact finger area 304, the via contact pad 308 may be coupled to the contact finger area 304 at various portions of the contact finger trace 302. A portion 314 of the contact finger trace 302 on a first side 316 of the substrate 306 is substantially covered by a solder mask 318. Upon the circuit board 300 being subject to a cleaning solution as described above, there is no etching of the via contact pad 308, as all exposed portions of the via contact pad 308 are plated in the same material as the contact finger area 304. Additionally, there is no electrical connection between the via contact pad 308 and other traces, such as the first trace 310 and/or the second trace 312, during the cleaning process. This further prevents any etching due to the galvanic effect.

As described above, a connection between the via contact pad 308 and the first trace 310 and the second trace 312 is required to connect the contract finger area 304 to components within the data storage device 102. To avoid etching due to galvanic voltage generation, the connection between the via contact pad 308 and the first trace 310 and the second trace 312 is performed after a cleaning and subsequent OSP process has been performed.

Figure 4:
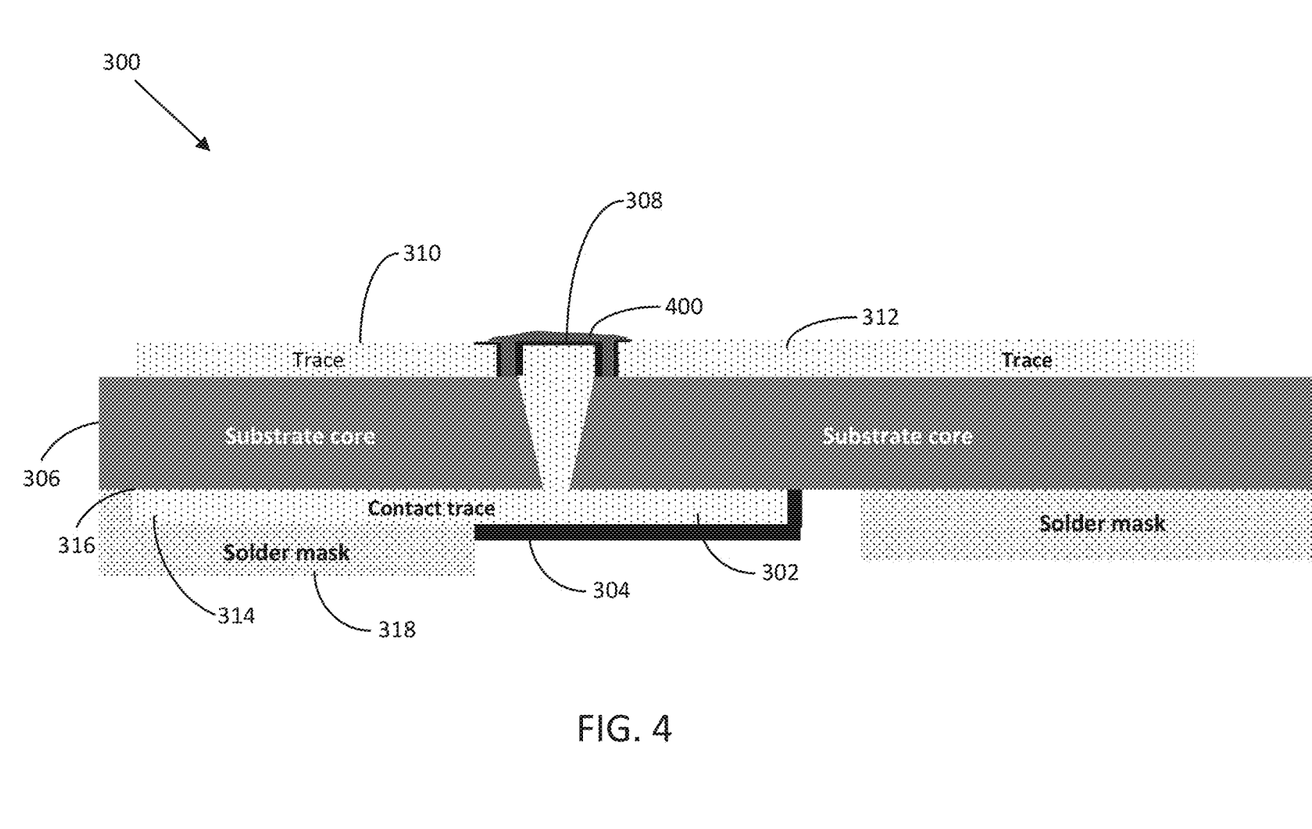
FIG. 4 is an enlarged cross-sectional view of the substrate of FIG. 3 illustrating a solder connection configuration, according to some embodiments.

Turning now to FIG. 4, the circuit board 300 of FIG. 3 is shown after a subsequent soldering process has been performed. As shown in FIG. 4, a solder joint 400 is formed by reflowing solder to create an electrical connection between the via contact pad 308 and the first trace 310 and the second trace 312. The solder joint 400 may use a known solder material, such as gold, silver, silver-tin, tin-lead, lead, or other solder material as required for a given application. As the solder joint 400 is configured to completely fill the separation distance G1 as well as form a connection across a top surface of the via contact pad 308 and the first trace 310 and the second trace 312, a low impedance connection is made between the via contact pad 308 and the first trace 310 and the second trace 312. In one embodiment, the impedance between the via contact pad 308 and the first trace 310 and the second trace 312 after soldering is less than 1 mΩ. However, values of more than 1 mΩ or less than 1 mΩ are also contemplated as applicable for a given application.

Figure 5:
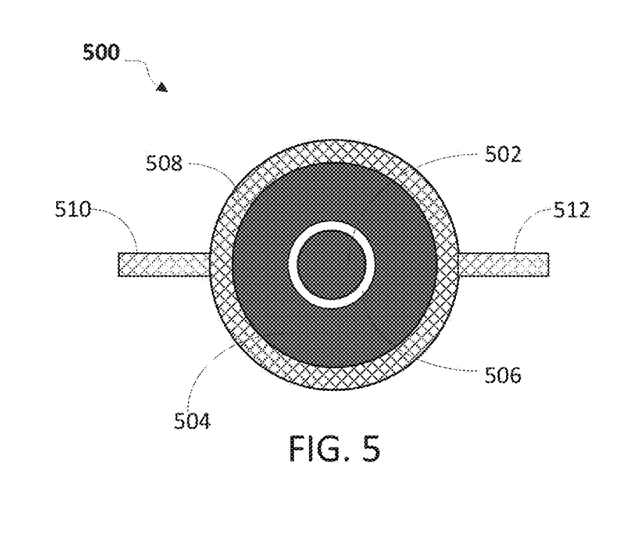
FIG. 5 is an enlarged top view of a connection pad is shown, according to some embodiments.

Turning now to FIG. 5, a top view of a connection pad 500 is shown, according to some embodiments. The connection pad 500 may include an inner pad 502. The inner pad 502 may be similar to the via contact pad 308, described above, and is used to provide a connection to a contact finger area using a via, as described above. The inner pad 502 may be separated from an outer pad 504 by a separation distance 506. The separation distance 506 may be similar to the separation distance G1 described above. Further, the outer pad 504 serves as a portion of an impedance trace, such as first trace 310 and second trace 312 described above. Thus, as discussed above, the first trace 310 and the second trace 312 may be continuous (e.g., electrically coupled) and only separated from the via contact pad 308 via a separation distance. In some embodiments, the inner pad 502 and the outer pad 504 may be plated with a same material, such as gold, nickel-gold, or other plating material as required for a given application. In one embodiment, the plating material is the same as a contact finger area, such as contact finger area 304, described above.

A portion 508 of the outer pad 504 may not be plated, as shown in FIG. 5. However, in some examples, the entire outer pad 504 or none of the outer pad 504 may be plated. A first trace 510 and a second trace 512 are coupled to the outer pad 504 and may be configured to connect to various other components or connection points within a data storage device 102. As described above, the separation distance 506 provides electrical separation between the inner pad 502 and the outer pad 504, and therefore between the outer pad 504, first trace 510, second trace 512, and a contact finger area, such as contact finger area 304 described above. This electrical separation reduces and/or eliminates etching of any of the outer pad 504, first trace 510, and/or second trace 512 due to the galvanic effect.

Figure 6:
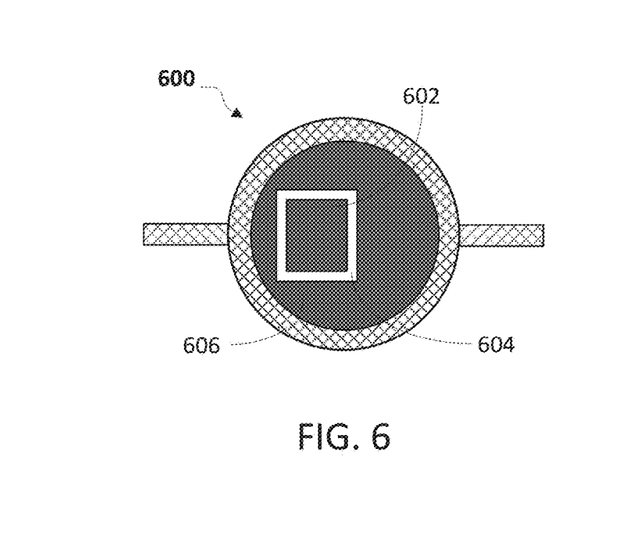
FIG. 6 is an enlarged top view of an alternative connection pad design, according to some embodiments.

As shown in FIG. 5, the inner pad 502 and the outer pad 504 are generally circular in nature. Turning now to FIG. 6, a top-down view shows an alternative design for a connection pad 600. In the connection pad 600, the inner pad 602 is square in shape, along with the separation distance 604. However, the outer pad 606 is circular, similar to the outer pad 504 discussed above. Apart from the shape change of the inner pad 602 and the separation distance 604, the functionality of the connection pad 600 is the same as the connection pad 500 described above. Furthermore, as shown in FIG. 6, the inner pad 602 may be offset from the center of the outer pad 504 in various directions and orientations, as would be appropriate for a given application.

Figure 7:
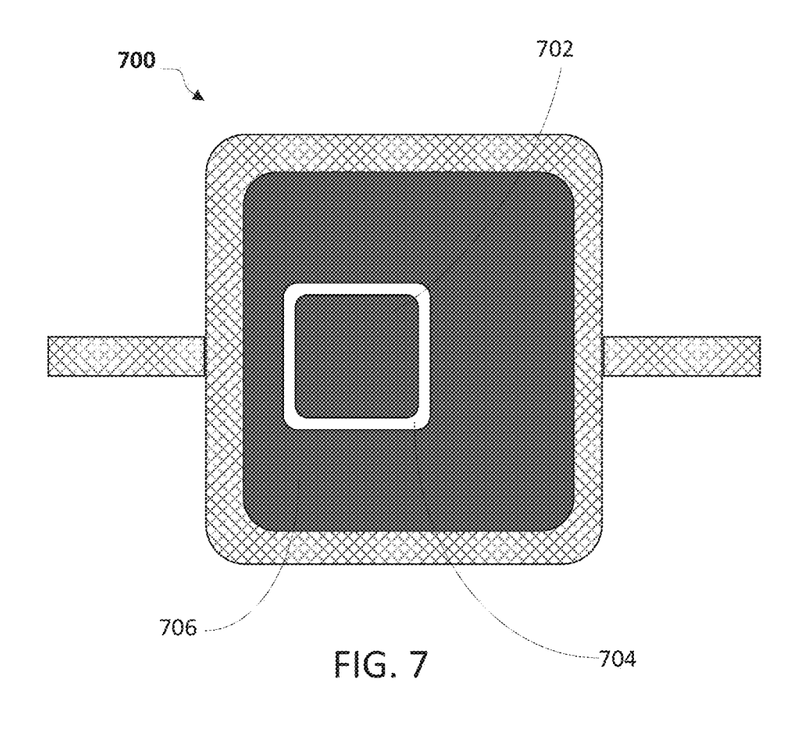
FIG. 7 is an enlarged top view of a further alternative connection pad design, according to some embodiments.

Turning now to FIG. 7, a top-down view shows a further alternative design for a connection pad 700. In the connection pad 700, an inner pad 702, a separation distance 704, and an outer pad 706 are all generally square in shape. However, apart from the shape change of the inner pad 702, the separation distance 704, and the outer pad 706, the functionality of the connection pad 700 is the same as connection pads 500, 600 described above. While the general shape of the connection pad does not affect the functionality or reduction in galvanic effect, changes in the shape of the connection pad components may be useful for routing or design purposes to allow for traces and connection pads to be efficiently routed and/or placed within a data storage device 102.

Figure 8:
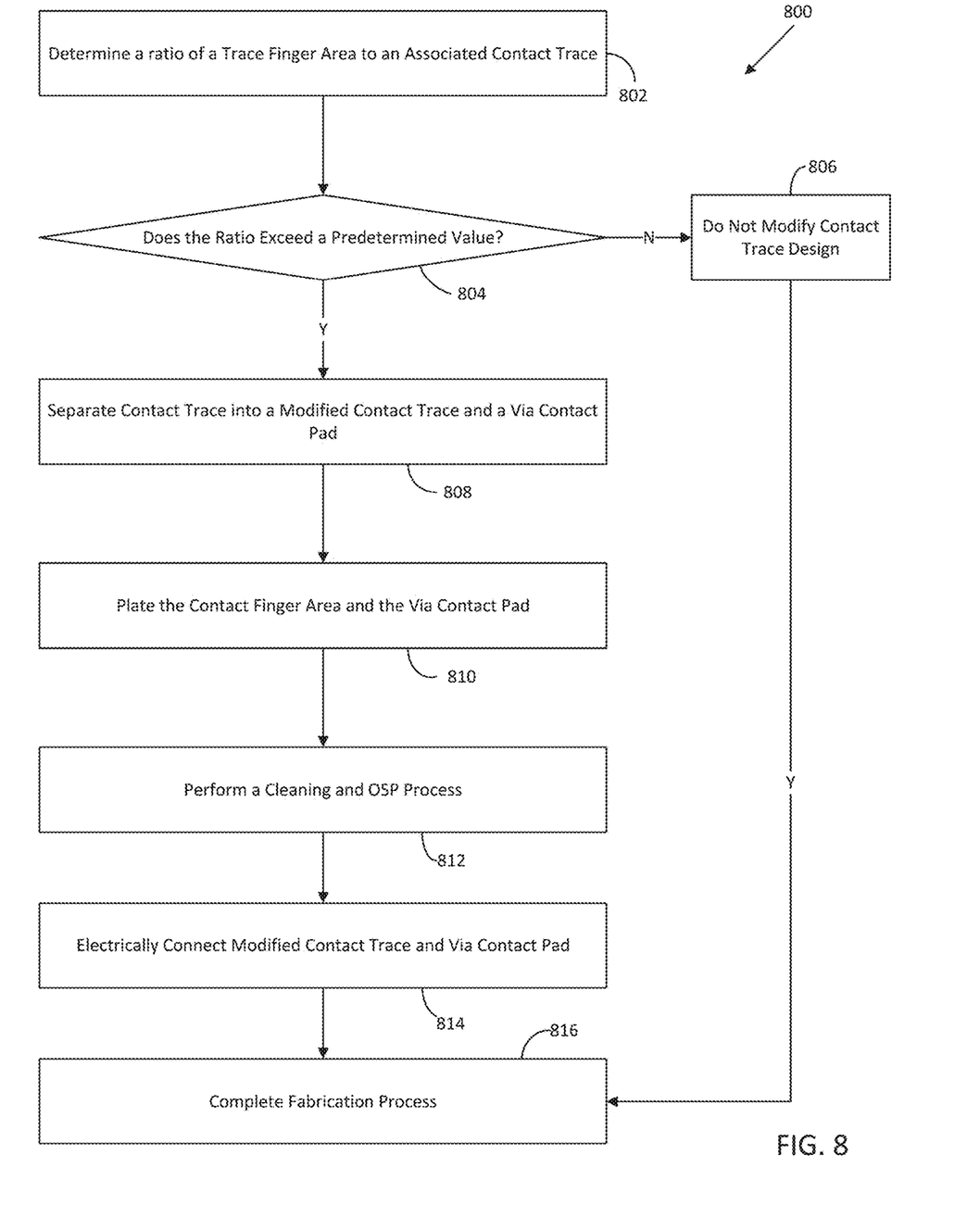
FIG. 8 is a flow chart illustrating a process for reducing galvanic effect, according to some embodiments.

Turning now to FIG. 8, a process 800 for reducing etching on a contact trace coupled to a contact finger or other external device connection point on a data storage device due to galvanic effect is described, according to some embodiments. The process 800 is described with reference to the circuit board 300 and data storage device 102 described above, but it is contemplated that the process 800 is applicable for any data storage device having contact fingers constructed of a different material than an internal contact trace electrically coupled to the contact fingers. The process 800 may be performed by one or more electronic processors or computing devices executing software or other computer implemented instructions for performing the following functions.

At block 802, a ratio of the surface area of a contact finger, such as contact finger area 304, to the surface area of an exposed contact trace, such first trace 310 and second trace 312, in electrical connection with a contact finger trace, such as contact finger trace 302, of the data storage device is calculated. In one embodiment, the exposed contact trace is the portion of a contact trace that is not encapsulated by solder mask and exposed without any plating or coating. The contact finger is the plated portion of the contact trace that is configured to interface with a host device and is plated with a different material than the contact trace. In some embodiments, a galvanic voltage may be calculated based on the ratio of the surface area and materials of the contact finger to the surface area of the exposed contact trace.

At block 804, a determination as to whether the calculated ratio exceeds a predetermined value is determined. In some embodiments, the predetermined value may be a twenty to one ratio. However, ratios of more than twenty to one, or less than twenty to one are also contemplated. In some examples, the predetermined value ratio may be fifteen to one ratio. The predetermined value may vary based on the types of material associated with the contact finger and the exposed contact trace. In some embodiments, a determination as to whether the calculated galvanic voltage, based at least in part on the calculated ratio and the materials of the contact finger and the exposed contact trace, exceeds a predetermined value is made. For example, a predetermined galvanic voltage value may be 0.3V. However, values of more than 0.3V or less than 0.3V. In some examples, the predetermined galvanic voltage level may be determined based on an expected amount of etching resulting from the galvanic voltage level exceeding a desired amount.

In response to determining that the ratio does not exceed a predetermined value, the contact trace is not modified at block 806. In response to determining that the ratio does exceed a predetermined value, the exposed contact trace is separated into a modified contact trace, such as outer pad 504 described above, which is then coupled to the first trace 310 and second trace 312, and a separate pad, such as via contact pad 308, at block 808, to separate the first trace 310 and the second trace 312 from the contract finger trace 302 by a separation distance, such as separation distance G1 described above. Thus, the modified contact trace is electrically isolated from the contact trace and the separate pad by the separation distance.

At block 810, the separate pad is plated with the same material as the contact finger area 304 as described above. In some examples, the modified contact trace (e.g., outer pad) is plated with a same material as the separate pad, as described above. In some examples, only a portion of the modified contact trace may be plated with the same material as the separate pad, as described above with respect to FIG. 5. In some examples, the modified contact trace and the first portion of the separate pad are plated at the same time, and with the same material, as the contact finger. Plating all or a portion of the modified contact trace with the same material as the separate pad may allow for a more effective connection during soldering. In one embodiment, the plating material is gold. In other embodiments, the plating material is a nickel-gold compound. Other plating materials are contemplated as appropriate for a given application. By plating the separate pad with the same material as the contact finger, etching of the separate pad due to Galvanic effect is reduced or eliminated.

At block 812 a cleaning and pre-soldering process is performed, such as described above. For example, a cleaning solution may first be applied to the data storage device to remove any organic materials, and an OSP process may then be performed to prevent contamination to the traces and other connections on the data storage device.

At block 814, a soldering operation provide a connection between the separate pad and the modified contact trace. As described in FIG. 4, a solder material may be reflowed to fill the separation distance between the separate pad and the modified contact trace, as well as to provide an overlapping area between the separate pad and the modified contact trace.

After the connections between the modified exposed contact trace and the first portion of the impedance trace is completed, any remaining fabrication processes are performed at block 816. The remaining fabrication processes may include component placement, additional soldering, and application of a molding material to encapsulate the components of the data storage device.

Figure 9:
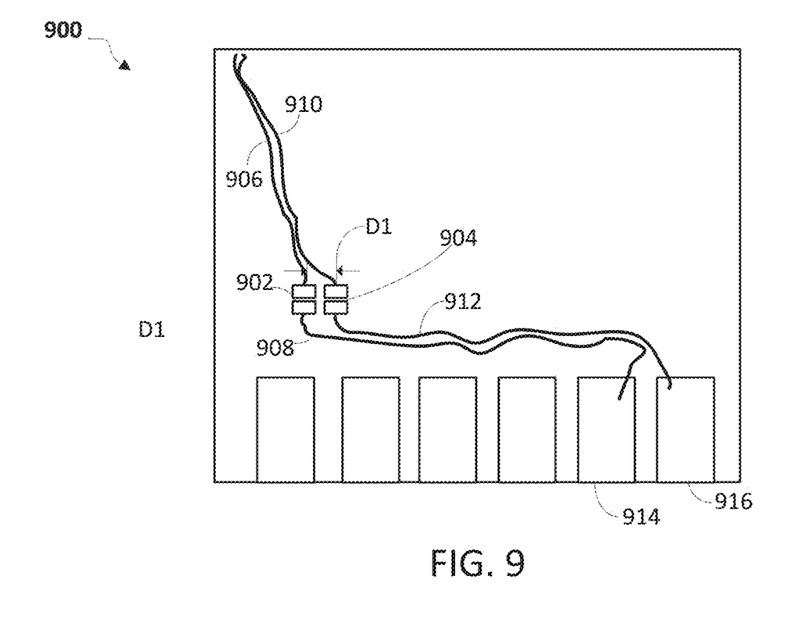
FIG. 9 is a substrate layout of a circuit using a split pad design for reducing galvanic etching, according to some embodiments.

Turning now to FIG. 9, a partial substrate circuit layout 900 of a data storage device, such as those described above, using a split pad design to reduce etching due to the galvanic effect is shown, according to some embodiments. The layout 900 illustrates a substrate layout where the connections to the contact finger areas are separated using split contact pads 902, 904, which require a connection to be made either using a wire or other component. A first trace 906 is coupled to a first portion of the split contact pad 902 and a second trace 908 is coupled to a second portion of the split contact pad 902. Similarly, a third trace 910 is coupled to a first portion of the split contact pad 904 and a fourth trace 912 is coupled to a second portion of the split contact pad 904. The second trace 908 is coupled to a first contact finger 914 and the fourth trace is coupled to a second contact finger 916. As shown in FIG. 9, due to the configuration of the split contact pads 902, 904, both the first trace 906 and the third trace 910, as well as the second trace 908 and the fourth trace 912 are separated by a distance D1. Distance D1 may be about 400 µm to about 500 µm. However, other distances greater than 500 µm are also contemplated. The distance D1 is dictated by the required spacing between the split contact pads 902, 904 in order to maintain proposer spacing between traces.

Figure 10:
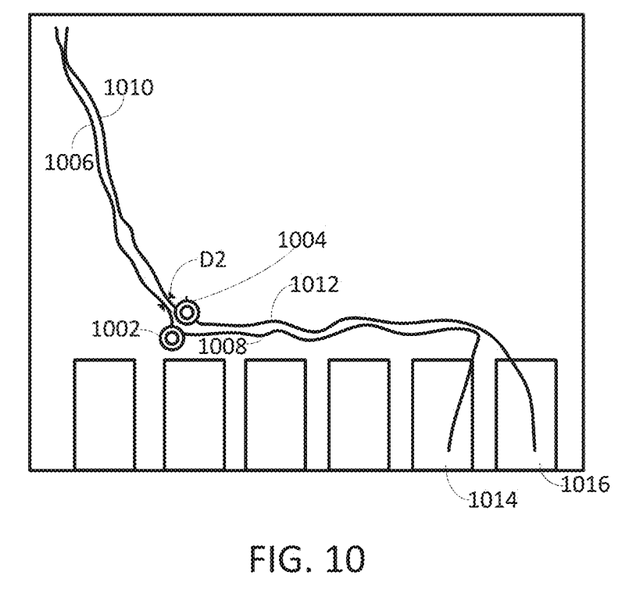
FIG. 10 is a substrate layout of a circuit using a via contact pad design for reducing galvanic etching, according to some embodiments.

Turning now to FIG. 10, a partial substrate circuit layout 1000 of a data storage device, such as those described above, using a via contact pad described above to reduce etching due to the galvanic effect is shown, according to some embodiments. The layout 1000 illustrates a substrate layout where the connections to the contact finger areas are separated using via contact pads 1002, 1004, which require a connection to be made either with a wire or other component. A first trace 1006 is coupled to a first portion of the via contact pad 1002, such as an outer pad as described above and a second trace 1008 is coupled to a second portion of the via contact pad 1002, such as via the inner pad described above. Similarly, a third trace 1010 is coupled to a first portion of the of the via contact pad 1002, such as an outer pad described above and a fourth trace 1012 is coupled to a second portion of the via contact pad 1002, such as using the inner pad as described above. The second trace 1008 is coupled to a first contact finger 1014 and the fourth trace 1012 is coupled to a second contact finger 1016. As shown in FIG. 10, due to the configuration of the via contact pads 1002, 1004, both the first trace 1006 and the third trace 1010, as well as the second trace 1008 and the fourth trace 1012 are separated by a distance D2. Distance D2 may be about 300 µm to about 400 µm. However, other distances less than 300 µm are also contemplated. Thus, by using via contact pads instead of split contact pads, the distances between the traces may be able to be reduced by about 25%, thus allowing for additional component and/or trace density within the data storage device.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A printed circuit board for an electronic device, comprising:
    a substrate having a first side and a second side opposite to the first side;
    a contact finger disposed on the first side of the substrate configured to interface with an external electronic device;
    a contact trace coupled to the contact finger and extending from the first side of the substrate to the second side of the substrate, wherein the contact trace has an exposed portion disposed on the second side of the substrate in the form of a via connection pad; and
    an impedance trace disposed on the second side of the substrate and configured to be coupled to one or more components of the electronic device;
    an outer pad coupled to the impedance trace, wherein the outer pad surrounds the via connection pad and is electrically separated from the via connection pad by a separation distance;
    wherein the contact finger and the via connection pad are plated with a common material to reduce galvanic etching of the contact trace; and
    wherein the via connection pad of the contact trace is electrically connected to the impedance trace by way of a solder joint.

2. The printed circuit board of claim 1, wherein the outer pad is plated with the common material.

3. The printed circuit board of claim 1, wherein the separation distance separates the outer pad and the via connection pad by a distance of at least 15 µm.

4. The printed circuit board of claim 1, wherein the via connection pad and the outer pad are circular.

5. The printed circuit board of claim 1, wherein the via connection pad is a square shape and the outer pad is circular.

6. The printed circuit board of claim 1, wherein the via connection pad and the outer pad are a square shape.

7. The printed circuit board of claim 1, wherein the common material is gold.

8. The printed circuit board of claim 1, wherein the common material is nickel-gold.

9. A method for reducing etching due to galvanic effect in a printed circuit board in an electronic device, the method comprising:
    determining a ratio of a surface area of a contact finger to a surface area of an exposed portion of a contact trace electrically connected to the contact finger, wherein the contact finger is configured to provide an electrical connection to an external electronic device;
    determining whether the ratio exceeds a predetermined threshold;

responsive to determining that the ratio exceeds the predetermined threshold, separating the exposed portion of the contact trace into a via connection pad and an outer connection pad configured to be coupled to an impedance trace, wherein the via connection pad and outer connection pad are physically separated by a separation distance;

plating the contact finger and the via connection pad with a common material; and electrically connecting the via connection pad and the outer connection pad using a solder joint.

10. The method of claim 9, wherein the outer pad is at least partially plated with the common material.

11. The method of claim 9, wherein the separation distance separates the outer pad and the via connection pad by a distance of at least 15 μm.

12. The method of claim 9, wherein the via connection pad and the outer pad are circular.

13. The method of claim 9, wherein the via connection pad is a square shape and the outer pad is circular.

14. The method of claim 9, wherein the common material is gold.

15. A card-type data storage device, comprising:
a substrate having a first side and a second side opposite to the first side;
a contact finger disposed on the first side of the substrate configured to interface with a host device and plated with a plating material;
a first trace coupled to the first contact finger and extending from the first side of the substrate to the second side of the substrate, wherein the first trace has an exposed portion disposed on the second side of the substrate in the form of a via connection pad, the via connection pad being plated with the plating material; and
a second trace disposed on the second side of the substrate and coupled to an outer pad, wherein the outer pad surrounds the via connection pad and is electrically separated from the via connection pad by a separation distance; and
wherein the via connection pad is electrically connected to the outer pad through a solder joint.

16. The card-type data storage device of claim 15, outer pad is plated with the plating material.

17. The card-type data storage device of claim 15, wherein the separation distance separates the outer pad and the via connection pad by a distance between 1 μm and 100 μm.

18. The card-type data storage device of claim 15, wherein the via connection pad is a square shape and the outer pad is circular.

19. The card-type data storage device of claim 15, wherein the via connection pad and the outer pad are circular.

20. The card-type data storage device of claim 15, wherein the plating material is at least one of gold or nickel-gold.

* * * * *